United States Patent
Takagi

(12) 
(10) Patent No.: US 6,339,232 B1
(45) Date of Patent: Jan. 15, 2002

(54) SEMICONDUCTOR DEVICE

(75) Inventor: Shinichi Takagi, Kanagawa-ken (JP)

(73) Assignee: Kabushika Kaisha Toshiba, Kawasaki (JP)

(*) Notice: Subject to any disclaimer, the term of this patent is extended or adjusted under 35 U.S.C. 154(b) by 0 days.

(21) Appl. No.: 09/665,682

(22) Filed: Sep. 20, 2000

(30) Foreign Application Priority Data

Sep. 20, 1999 (JP) .............................. 11-265553

(51) Int. Cl.[7] ...................... H01L 31/072; H01L 31/109
(52) U.S. Cl. .................. 257/192; 257/347; 257/190; 438/47
(58) Field of Search ............................... 257/192, 217, 257/327, 347

(56) References Cited

U.S. PATENT DOCUMENTS

| 5,461,250 A | * 10/1995 | Burghartz et al. ......... 257/192 |
| 5,534,713 A | 7/1996 | Ismail et al. |
| 5,847,419 A | 12/1998 | Imai et al. |

FOREIGN PATENT DOCUMENTS

JP 9-321307 12/1997

* cited by examiner

Primary Examiner—David Nelms
Assistant Examiner—Andy Huynh
(74) Attorney, Agent, or Firm—Finnegan, Henderson, Farabow, Garrett & Dunner, L.L.P.

(57) ABSTRACT

There is provided a semiconductor device in which gate electrodes of both an n-channel field effect transistor and a p-channel field effect transistor constituting a complementary field effect transistor are made of the same material and threshold voltages of both are sufficiently lowered. In the semiconductor device including an n-channel MOSFET and a p-channel MOSFET which constitute a CMOS structure, the gate electrode of the n-channel MOSFET and the gate electrode of the p-channel MOSFET are made of the same material, at least a part of a channel region of the n-channel MOSFET is formed in a strained Si layer, at least a part of a channel region of the p-channel MOSFET is formed in an SiGe layer, the work function of the material making the gate electrodes is higher than an energy difference between the conduction band edge of the strained Si layer and the vacuum level, and is lower than an energy difference between the valence band edge of the SiGe layer and the vacuum level.

21 Claims, 3 Drawing Sheets

(a)

(b)

(c)

(d)

(a)

(b)

(c)

SEMICONDUCTOR DEVICE

FIELD OF THE INVENTION

The present invention relates to a semiconductor device, and particularly to a semiconductor device including a complementary Metal-Oxide-Semiconductor field effect transistor (CMOSFET).

BACKGROUND OF THE INVENTION

In recent years, the size of a CMOSFET has been miniaturized, and it is expected that the advancement is further made beyond the 0.1 µm generation. After this, it is considered that as the size is miniaturized more, various problems as indicated in the SIA (Semiconductor Industry Association) Roadmap occur.

As the size of the CMOSFET is miniaturized more, problems occur, one of which relates to a gate electrode. Conventionally, although polycrystalline silicon is used for the gate electrode, it is difficult to dope polycrystalline silicon with an impurity at a high concentration. Thus, there is a problem that a gate capacitance is lowered by depletion in polycrystalline silicon makes current driving power increase and interferes with suppression of a short channel effect.

In order to solve this problem, a CMOSFET using metal/oxide/semiconductor field effect transistor (MOSFET), in which metal is used as a material of a gate electrode, has been studied. However, in order to realize a CMOSFET of the sub-0.1 micron generation by using a metal gate, the following problem still remains.

In general, in a CMOSFET having a gate electrode made of metal, in order to simplify a manufacturing process, the same metal is used for the gate electrodes of an n-channel MOSFET and a p-channel MOSFET. In such a CMOSFET, in the case where an impurity concentration in a substrate is set so that the short channel effect is sufficiently suppressed, normally, in both of them, a threshold voltage becomes as high as 0.5 V or higher. Since a power voltage of 1 V or less is expected in the CMOSFET of the sub-0.1 micron generation, such a high threshold voltage causes a drop in current driving power of the MOSFET, and further, a drop in operation speed of a circuit.

SUMMARY OF THE INVENTION

The present invention has been made in view of the above problem, and has an object to provide a semiconductor device in which gate electrodes of both an n-channel MOSFET and a p-channel MOSFET constituting a CHOSFET are made of the same material, and a threshold voltage of each of them is sufficiently decreased.

Another object of the present invention is to provide a semiconductor device that includes an n-channel MOSFET and a p-channel MOSFET constituting a CMOSFET and can be manufactured by a simplified process.

According to a first aspect of the present invention, a semiconductor device comprises a semiconductor substrate, and an n-channel field effect transistor and a p-channel field effect transistor respectively formed on the semiconductor substrate, the n-channel field effect transistor and the p-channel field effect transistor constitute a complementary field effect transistor, and the semiconductor device is characterized in that a gate electrode of the n-channel field effect transistor and a gate electrode of the p-channel field effect transistor are made of the same material, a channel region of the n-channel field effect transistor is made of at least of Si and in which an energy difference between a conduction band edge and a vacuum level is higher than that of bulk Si, and a channel region of the p-channel field effect transistor is made of at least of Si and in which an energy difference between a valence band edge and the vacuum level is lower than that of bulk Si, a work function of the material making the gate electrodes is higher than the energy difference between the conduction band edge of the material making the channel region of the n-channel field effect transistor and the vacuum level, and is lower than the energy difference between the valence band edge of the material making the channel region of the p-channel field effect transistor and the vacuum level.

At this time, it is preferable to introduce tensile stress into the material making the channel region of the n-channel field effect transistor.

It is preferable to introduce compressive stress into the material making the channel region of the p-channel field effect transistor.

It is preferable that the material making the channel region of the n-channel field effect transistor is Si into which tensile stress is introduced. It is so-called strained Si in this specification.

It is preferable that the material making the channel region of the p-channel field effect transistor is SiGe.

It is preferable that the Fermi level EF of the gate electrode material is $(4E_{v2} + E_{c1})/5$ or less and $(E_{v2} + 4E_{c1})/5$ or less, $E_{v2}$ is the valence band edge of the material making the channel region of the p-channel field effect transistor and $E_{v1}$ is the conduction band edge of the material making of the channel region of the n-channel field effect transistor.

It is preferable that the Fermi level $E_F$ of the gate electrode material is substantially $(E_{v2} + E_{c1})/2$, $E_{v2}$ is the valence band edge of the material making the channel region of the p-channel field effect transistor and $E_{c1}$ is the conduction band edge of the material making of the channel region of the n-channel field effect transistor.

It is preferable that $E_{c1}$ of the channel material of the n-channel MOSFET is higher than $(E_{v0} + E_{c0})/10$ and not higher than $(E_{v0} + E_{c0})/2$, $E_{v0}$ is the valence band edge of the bulk Si and $E_{c0}$ is the conduction band edge of the bulk Si.

It is preferable that $E_{v2}$ of the channel material of the p-channel MOSFET is not less than $(E_{v0} + E_{c0})/2$ and less than $(9E_{v0} + E_{c0})/10$, Evo is the valence band edge of the bulk Si and $E_{c0}$ is the conduction band edge of the bulk Si.

According to a second aspect of the present invention, a semiconductor device comprises a semiconductor substrate; an n-channel field effect transistor formed on the semiconductor substrate; and a p-channel field effect transistor formed on the semiconductor substrate, the n-channel field effect transistor and the p-channel field effect transistor constituting a complementary field effect transistor, wherein a gate electrode of the n-channel field effect transistor and a gate electrode of the p-channel field effect transistor are made of a same material, wherein at least a part of a channel region of the n-channel field effect transistor is formed in a strained Si layer, wherein at least a part of a channel region of the p-channel field effect transistor is formed in a first SiGe layer, and wherein a work function of the material making the gate electrodes is higher than an energy difference between a conduction band edge of the strained Si layered and a vacuum level, and is lower than an energy difference between a valence band edge of the first SiGe layer and the vacuum level.

It is preferable that the n-channel field effect transistor includes a second SiGe layer, which has the same composition ratio as the first SiGe layer and is disposed between the semiconductor substrate and the strained Si layer, and a tensile stress is introduced into the strained Si layer from the second SiGe layer.

It is preferable that the n-channel field effect transistor includes a second SiGe layer which has a Ge concentration higher than the first SiGe layer and is disposed between the semiconductor substrate and the strained Si layer, the p-channel field effect transistor includes a third SiGe layer which has the same composition ratio as the second SiGe layer and is disposed between the semiconductor substrate and the first SiGe layer, a tensile stress is introduced into the strained Si layer from the second SiGe layer, and compressive stress is introduced into the first SiGe layer from the third SiGe layer.

It is preferable that the p-channel field effect transistor includes a Si layer between the first SiGe layer the third SiGe layer.

It is preferable that the first SiGe layer composes $Si_{1-x}Ge_x$ and the second SiGe layer composes $Si_{1-y}Ge_y$ (y>x).

According to the first or second aspect of the invention, it is preferable that the gate electrodes of the n-channel field effect transistor and p-channel field effect transistor are made of a material selected from the group consisting of metal, doped p-type polycrystalline Ge, and doped p-type polycrystalline SiGe.

According to the first or second aspect of the invention, it is preferable that the semiconductor device further comprises an insulating film between the semiconductor substrate and the n-channel field effect transistor/the p-channel field effect transistor.

According to the first or second aspect of the invention, it is preferable that the semiconductor device further comprises an insulating film between the semiconductor substrate and the complementary field effect transistor.

According to the third aspect of the invention, a semiconductor device comprises a semiconductor substrate; an n-channel field effect transistor formed on the semiconductor substrate; and a p-channel field effect transistor formed on the semiconductor substrate, the n-channel field effect transistor and the p-channel field effect transistor constituting a complementary field effect transistor, wherein a gate electrode of the n-channel field effect transistor and a gate electrode of the p-channel field effect transistor are made of a same material, and wherein one of the n-channel field effect transistor and the p-channel field effect transistor includes a first semiconductor layer in which at least a part of a channel region is formed, the other of the n-channel field effect transistor and the p-channel field effect transistor includes a second semiconductor layer in which at least a part of a channel region is formed and a third semiconductor layer as its under layer, and the first semiconductor layer and the third semiconductor layer are made of a same material.

It is preferable that the semiconductor device comprises further an insulating film between the semiconductor substrate and the complementary field effect transistor.

It is preferable that a work function of the material making the gate electrodes of the n-channel field effect transistor and p-channel field effect transistor is higher than an energy difference between a conduction band edge of a material making the channel region of the n-channel field effect transistor and a vacuum level, and is lower than an energy difference between a valence band edge of a material making the channel region of the p-channel field effect transistor and the vacuum level.

According to the first aspect of the invention, an energy difference between a conduction band edge of a material making the channel region of the n-channel field effect transistor and vacuum level and an energy difference between a valence band edge of a material making the channel region of the p-channel field effect transistor and the vacuum level are controlled such as above described and a work function of the material making the gate electrodes is in an energy difference between two energies. Thus, the threshold of the n-channel field effect transistor and p-channel field effect transistor can decrease.

According to the second aspect of the invention, since at least a part of a channel region of the n-channel field effect transistor is formed in a strained Si layer, an energy difference between a conduction band edge of the strained Si and a vacuum level can be higher than that of bulk Si and vacuum level. Since at least apart of a channel region of the p-channel field effect transistor is formed in a SiGe, which is an energy difference between a valence band edge of Ge and vacuum level is lower than that of bulk Si and a vacuum level, an energy difference between a valence band edge of the SiGe and vacuum level can be lower than that of bulk Si and vacuum.

An energy difference between a conduction band edge of the strained Si making the channel region of the n-channel field effect transistor and vacuum level and an energy difference between a valence band edge of the SiGe making the p-channel field effect transistor and the vacuum level are controlled such as above described and a work function of the material making the gate electrode is in an energy difference between two energies. Thus, the threshold of the n-channel field effect transistor and p-channel field effect transistor can decrease.

According to the third aspect of the invention, a composition of the first semiconductor layer and the third semiconductor layer is same and a tensile stress is introduced into the second semiconductor layer from the third semiconductor layer. The first and third semiconductor layers are deposited at same time. The tensile stress is introduced into the second semiconductor layer by depositing the second semiconductor layer on the third semiconductor layer. The second semiconductor layer can be strained with no increasing of another procedure, comparing to comprise the first and second semiconductor layer by different material.

In order to produce the semiconductor of the invention, a method of manufacturing a semiconductor device including a semiconductor substrate, and an n-channel field effect transistor and a p-channel field effect transistor respectively formed on the semiconductor substrate, the n-channel field effect transistor and the p-channel field effect transistor constituting a complementary field effect transistor, the method is characterized by comprises;

forming a first semiconductor layer on one main surface of the semiconductor substrate; forming a second semiconductor layer on a part of the first semiconductor layer, into which tensile stress or compressive stress is introduced from the first semiconductor layer;

splitting the first and second semiconductor layers into elements correspondingly to the n-channel field effect transistor and the p-channel field effect transistor;

forming a gate insulating film on the first and second semiconductor layers;

forming gate electrodes on the gate insulating film correspondingly to the n-channel field effect transistor and the p-channel field effect transistor at the same time; and injecting an impurity into the first and second semiconductor layers using the gate electrodes as masks.

DETAILED DESCRIPTION OF THE PREFERRED EMBODIMENTS

Figure 1:
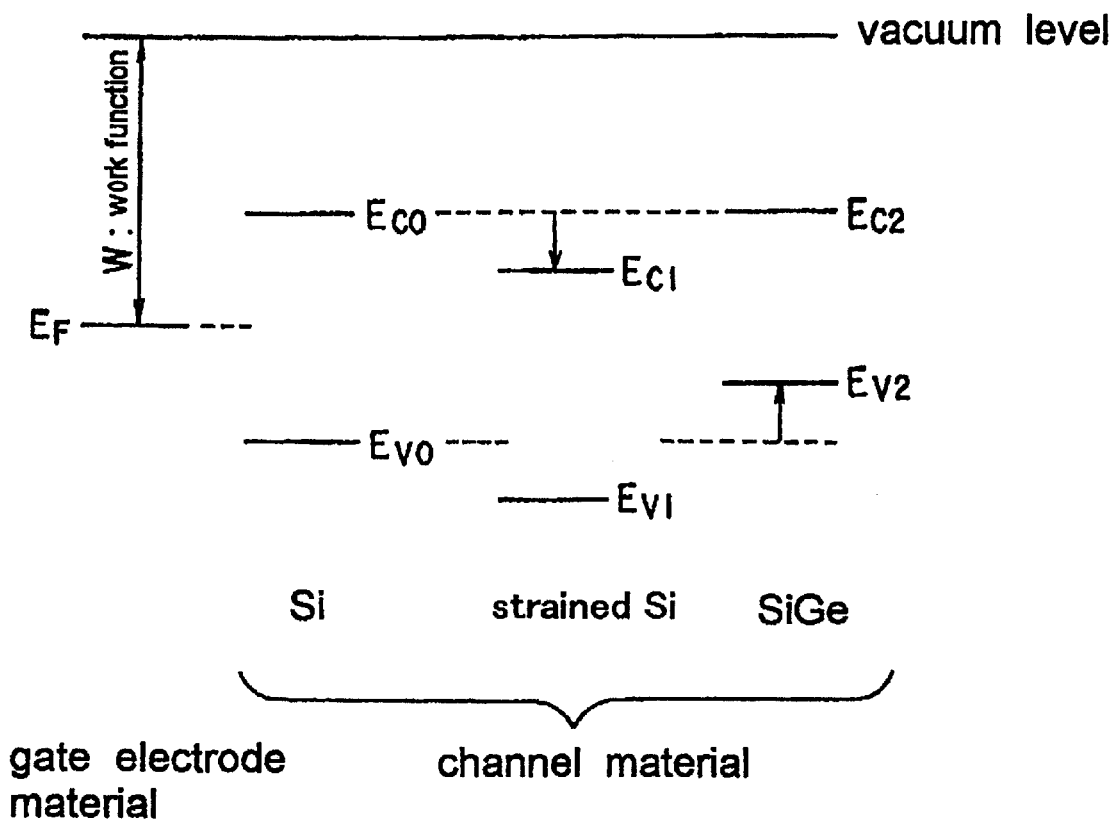
FIG. 1 is view showing schematically showing the principle of the present invention.

Hereinafter, preferred embodiments of the present invention are described in more detail with reference to the drawings. Incidentally, the same members in the respective drawings are designated by the same reference numerals, and duplicate explanation is omitted.

The basic structure of a semiconductor device of the present invention includes a CMOSFET constituted by an n-channel MOSFET and a p-channel MOSFET formed on a semiconductor substrate, a gate electrode of the n-channel MOSFET and a gate electrode of the p-channel MOSFET are made of the same material, and the material is selected such that the Fermi level of the gate electrode material is lower than the energy band of the conduction band edge of a semiconductor making a channel of the n-channel MOSFET, and is higher than the energy band of the valence band edge of a semiconductor making a channel of the p-channel MOSFET.

In other words, the gate electrode material is selected such that the work function thereof is higher than the energy difference between the conduction band edge of the semiconductor making the channel of the n-channel MOSFET and the vacuum level, and is lower than the energy difference between the valence band edge of the semiconductor making the channel of the p-channel MOSFET and the vacuum level. As a result, a low threshold voltage is realized in both the n-channel MOSFET and the p-channel MOSFET, and the high speed operation of the CMOSFET is attained.

Further, at this time, the invention is characterized in that the semiconductor of the channel region of the n-channel MOSFET and the semiconductor of the channel region of the p-channel MOSPET are made of different materials.

Figure 2:
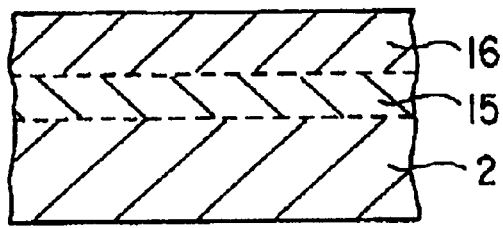
FIGS. 2A to 2D are sectional views schematically showing a manufacturing method of a semiconductor device according to a first embodiment of the present invention, respectively.
Figure 2:
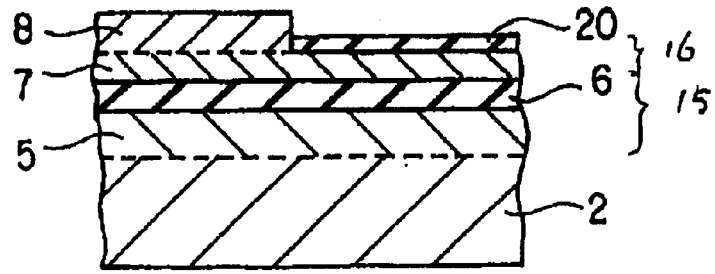
Figure 2:
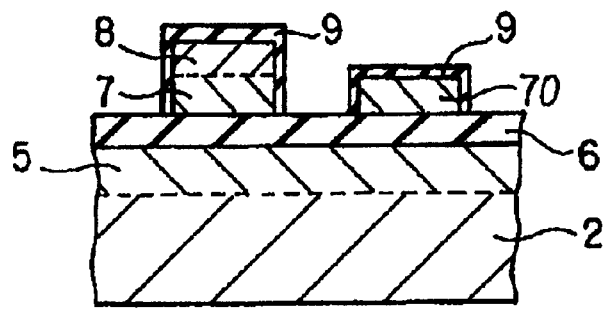
Figure 2:
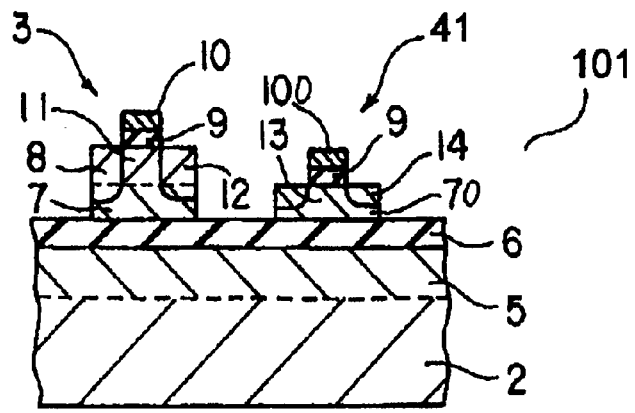

FIG. 2D is a sectional view of a semiconductor device of an embodiment of the present invention.

A semiconductor device 101 shown in FIG. 2D includes an n-channel MOSFET 3 and a p-channel MOSFET 41 on a semiconductor substrate 2. These MOSFETs constitute a CMOSFET. The semiconductor substrate 2 is, for example, a silicon substrate, and a SiGe layer 5 is formed on the surface of the substrate 2 and an oxide film 6 is formed on the SiGe layer 5.

The n-channel MOSFET 3 has such a structure that a SiGe layer 7, a Si layer 8, a gate insulating film 9, and a gate electrode 10 are sequentially laminated on the oxide film 6. Both the SiGe layer 7 and the Si layer 8 are single crystals, and tensile stress is introduced into the Si layer 8 from the SiGe layer 7. A channel region 11 is formed in the Si layer 8. Besides, source/drain regions 12 doped with an n-type impurity at a high concentration are formed in the Si layer 8 at both sides of the channel region 11.

The p-channel MOSFET 41 has such a structure that a SiGe layer 70, a gate insulating film 90, and a gate electrode 100 are sequentially laminated on the oxide film 6. In the p-channel MOSFET 41, differently from the n-channel MOSFET 3, a channel region 13 is formed in the SiGe layer 70. Besides, source/drain regions 14 doped with a p-type impurity at a high concentration are formed in the SiGe layer 70 at both sides of the channel region 13.

The gate electrode 10 of the n-channel MOSFET 3 and the gate electrode 100 of the p-channel MOSFET 41 are formed of the same material, and its work function has the above described relation to the material making the channel region 11 of the n-channel MOSFET and the channel region 13 of the p-channel MOSFET.

The channel region 11 of the n-channel MOSFET is made of strained silicon, and the energy difference between the conduction band edge of the strained silicon and the vacuum level is higher than the energy difference between the conduction band edge of bulk silicon and the vacuum level.

The channel region 13 of the p-channel MOSFET is made of SiGe, and the energy difference between the valence band. edge of SiGe and the vacuum level is lower than the energy difference between the valence band edge of bulk silicon and the vacuum level.

Next, the principle of the present invention is described.

In general, a threshold voltage $V_{th}$ of a MOSFET is simply given by the following expression (1).

$$V_{th}=V_{FB}+2\phi_B+2Q_B/C_{ox} \quad (1)$$

In the above expression (1), VFB is a flat band voltage, $\phi_B$ is a Fermi level in the substrate, $Q_B$ is a space charge surface density of the substrate, and $C_{ox}$ is a gate capacitance per unit area. If the gate oxide film is sufficiently thin in thickness, the term 3 of the above expression (1) can be ignored.

Thus, in the case where the gate electrodes and the channel regions of the n-channel MOSFET and the p-channel MOSFET are respectively made of the same materials, threshold voltages $V_{th}^{nMOS}$ and $V_{th}^{pMOS}$ of the n-channel MOSPET and the p-channel MOSFET can be expressed by the following expressions (2) and (3).

$$V_{th}^{nMOS}=(W-E_c-E_g/2-\phi_B)+2\phi_B=W-E_c-E_g/2+\phi_B \approx W-E_c \quad (2)$$

$$V_{th}^{nMOS}=(W-E_v+E_g/2+\phi_B)-2\phi_B=W-E_v+E_g/2-\phi_B \approx W-E_v \quad (3)$$

Incidentally, in the expressions (2) and (3), W is a work function of the gate electrode, Ec is an energy difference between the conduction band edge of the semiconductor making the channel region of the n-channel MOSFET and the vacuum level, Ev is an energy difference between the valence band edge of the semiconductor making the channel region of the p-channel MOSFET and the vacuum level, and Eg is a band gap of. the semiconductor making the channel region. Here, when usage of a CMOSFET is considered and the absolute values of the threshold voltages $V_{th}^{nMOS}$ and $V_{th}^{nMOS}$ of the n-channel MOSFET and the p-channel MOSFET are made coincident with each other, the following expressions (4) and (5) are obtained from the above expressions (2) and (3).

$$W = \frac{E_v + E_c}{2} \quad (4)$$

Thus, in the case where both the channel regions of the n-channel MOSFET and the p-channel MOSFET of the CMOSFET are made of silicon as usual, the threshold voltage becomes about 0.5 V which is almost half the band gap Eg of silicon. This value is too high in view of the fact that a power voltage of 1 V or less is expected in the sub-0.1 micron generation and the following.

In order to decrease the threshold voltage, the channel region should be made of a semiconductor material having a band gap Eg lower than silicon. However, in that case, other problems such as a short channel effect and junction leak current. If a material deviated from the scope of silicon technology is used, a conventional manufacturing process can not be used and the industrial realization becomes low.

According to the present invention, on the basis of consideration of the expressions (2) and (3), in the n-channel MOSFET, such a material is used that an energy difference Ec between the conduction band edge and the vacuum level is higher than that of bulk silicon, and in the p-channel MOSFET, such a material is used that an energy difference Ev between the valence band edge and the vacuum level is lower than that of bulk silicon. As the gate electrodes of the n-channel MOSFET and the p-channel MOSFET, the same material is used, and the material satisfies such conditions that its work function is larger than Ec of the channel material of the n-channel MOSFET and is lower than Ev of the channel material of the p-channel MOSFET. By constructing in this way, it is possible to effectively decrease the threshold voltage. This is described with reference to FIG. 1.

FIG. 1 is a view schematically showing the principle of the present invention, and is a band view showing a conduction band edge and a valence band edge of each of MOSFETs using silicon, strained silicon, and SiGe individually as a material making a channel region, and a Fermi level of a gate electrode.

In the CMOSFET of the present invention, strained silicon having an conduction band $E_{c1}$ and an valence band $E_{v1}$ is used as the channel material of the n-channel MOSFET. SiGe having conduction band $E_{c2}$ and valence band $E_{v2}$ is used as the channel material of the p-channel MOSFET. For the respective gate electrodes, a material having a Fermi level $E_F$ (work function W) is commonly used. For comparison, FIG. 1 shows silicon having conduction band edge $E_{c0}$ and valence band edge $E_{v0}$ for a channel.

As shown in FIG. 1, the Fermi level $E_F$ of the material making the gate electrode is between the conduction band edge $E_{c1}$ of strained Si that is the channel material of the n-channel MOSFET and the valence band edge $E_{v2}$ of SiGe that is the channel material of the p-channel MOSFET. The work function W of the gate electrode material is higher than the energy deference between conduction band edge $E_{c1}$ of strained silicon and is lower than the energy deference between valence band edge $E_{v2}$ of SiGe.

As shown in FIG. 1, in the semiconductor device of the present invention, the conduction band edge $E_{c1}$ of strained Si that is the channel material of the n-channel MOSFET is lower than the conduction band edge $E_{c0}$ of bulk Si. The valence band edge $E_{v2}$ of SiGe that is the channel material of the p-channel MOSFET is higher than the valence band edge $E_{v0}$ of bulk Si. In the semiconductor device of the present invention, the band gap between the conduction band edge of the n-channel MOSFET and the valence band edge of the p-channel MOSFET becomes low, and the Fermi level of the gate electrode is between these, so the threshold voltage is decreased in both the n-channel and p-channel MOSFETs.

The electron mobility of strained Si is increased by an effect that the strain exerts the band structure. Since the hole mobility of Ge is higher than that of Si, the hole mobility of the SiGe is higher than that of Si. These facts mean that the CMOSFET of the present invention that the channel region of the n-channel MOSFET is made of strained Si and the channel region of the p-channel MOSFET is made of SiGe has high current drive power and is excellent in circuit performance. In the CMOSFET of the present invention, strained Si is used for the channel of the n-channel MOSFET and SiGe is used for the channel of the p-channel MOSFET, so the threshold voltage can be decreased, and the other performance of the semiconductor device can also be increased.

In the present invention, it is preferable that the Fermi level $E_F$ of the gate electrode material is $(4E_{v2} + E_{c1})/5$ or less and $(E_{v2} + 4E_{c1})/5$ or less. Further, it is more preferable that $E_F$ is substantially $(E_{v2} + E_{c1})/2$. In this case, in both the n-channel MOSFET and the p-channel MOSFET, almost comparable threshold voltages can be realized.

It is preferable that $E_{c1}$ of the channel material of the n-channel MOSFET is higher than $(E_{c0} + 9E_{c0})/10$ and not higher than $(E_{v0} + E_{c0})/2$. It is preferable that $E_{v2}$ of the channel material of the p-channel MOSFET is not less than $(E_{v0} + E_{c0})/2$ and less than $(9E_{v0} + E_{c0})/10$. In this case, it is possible to realize a threshold voltage that is sufficiently low and has no problem in practical use.

The introduction of the tensile stress to the Si layer can be achieved by, for example, forming a thin film of the Si layer on an under layer made of SiGe by an epitaxial growth method. Since the lattice constant of SiGe is larger than Si, the strained Si layer can be obtained by epitaxial growth of thin Si layer on the SiGe layer.

$E_{c1}$ of the strained Si layer can be controlled by the magnitude of stress to be introduced. By controlling the lattice constant of the under layer of the Si layer, desired $E_{c1}$ can be obtained.

$E_{v2}$ of the SiGe layer can be controlled by the composition ratio of Si and Ge. $E_{v2}$ of the SiGe layer can also be controlled by introducing the stress to the SiGe layer. For example, when a single crystal Si layer is made an under layer and SiGe is formed on this layer by epitaxial growth, or when a single crystal SiGe layer is made an under layer and SiGe containing Ge at a concentration higher than that is formed on this layer by the epitaxial growth method, the SiGe layer to which compressive stress is introduced can be obtained. By doing so, it is possible to obtain the SiGe layer having higher $E_{v2}$.

As described above, in order to decrease $E_{c1}$ in the material of the channel region of the n-channel MOSFET, the Si layer formed on the SiGe under layer by the epitaxial growth method may be made the channel layer. In order to increase $E_{v2}$ in the material of the channel region of the p-channel MOSFET, the SiGe layer may be made the channel layer. Like this, since the control of both $E_{c1}$ and $E_{v2}$ is performed through the SiGe layer, the manufacturing process can be simplified by forming the SiGe layer of the n-channel MOSFET and the SiGe layer of the p-channel MOSFET by the same procedure.

Next, a manufacturing method of CMOSFET of the first embodiment of the present invention is described with reference to FIGS. 2A to 2D.

FIGS. 2A to 2D are sectional views schematically showing a manufacturing method of CMOSPET of the first embodiment of the present invention. A semiconductor device 101 shown in FIG. 2D includes an. n-channel MOSFET 3 and a p-channel MOSFET 41 on a semiconductor substrate 2. The semiconductor substrate 2 is, for example, a silicon substrate, and a SiGe layer 5 and an oxide film 6 are formed on its surface region.

The n-channel MOSFET 3 has such a structure that a SiGe layer 7, a Si layer 8, a gate insulating film 9, and a gate electrode 10 are sequentially laminated on the oxide film 6. Both the SiGe layer 7 and the Si layer 8 are single crystals, and tensile stress is introduced into the Si layer 8 from the SiGe layer 7. A channel region 11 is formed in the Si layer B. In the Si layer 8, source/drain regions 12 doped with an n-type impurity at a high concentration are formed at both side of the channel region 11.

The p-channel MOSFET 41 has such a structure that a SiGe layer 70, a gate insulating film 90, and a gate electrode 100 are sequentially laminated on the oxide film 6. In the p-channel MOSFET 41, differently from the n-channel MOSFET 3, the channel region 13 is formed in the SiGe layer 70. In the SiGe layer 70, source/drain regions 14 doped with a p-type impurity at a high concentration are formed at both side of the channel region 13.

The n-channel MOSFET 3 and the p-channel MOSPET 41 mutually constitute a CMOSFET.

The semiconductor device 101 shown in FIG. 2D can be manufactured by, for example, a method described below.

First, as shown in FIG. 2A, a SiGe buffer layer 15 and a $Si_{1-x}Ge_x$ buffer layer 16 are formed on one main surface of the silicon substrate 2 by an ultra high vacuum chemical vapor deposition (UHV-CVD) method. The SiGe buffer layer 15 is a thin film having a concentration gradient in which a Ge concentration becomes high in a film thickness direction from the surface side of the silicon substrate 2. On the other hand, the $Si_{1-x}Ge_x$ buffer layer 16 is a thin film having a constant Ge concentration, and normally, x is set within the range of 0.1 to 0.4.

Next, by the so-called SIMOXmethod, for example, an oxygen ion of an injection dosage of $4 \times 10^{17}$ cm$^{-2}$ is ion injected to the surface of the silicon substrate 2 on which the SiGe buffer layer 15 and the $Si_{1-x}Ge_x$ buffer layer 16 are formed, and further, annealing is carried out at 1350° C. to 1200° C. By this, as shown in FIG. 2B, the buried oxide film 6 is formed in the $Si_{1-x}Ge_x$ buffer layer 16. The buried oxide film 6 formed in this way is mainly made of silicon oxide and a region of about 400 nm from the surface of the Sil-xGeX buffer layer 16 remains not to be oxidized. The SiGe buffer layer 15 and the region of the $Si_{1-x}Ge_x$ buffer layer 16 which remains not to be oxidized are made the SiGe layers 5 and 7, respectively.

Next, an oxide film 20 such as a silicon oxide film is formed over the entire surface of the silicon substrate 2 on which the SiGe layer 7 is formed. Further, a part (region in which the n-channel MOSFET 3 is formed) of the oxide film 20 is removed, so a part of the SiGe layer 7 is exposed. Thereafter, Si is selectively epitaxially grown on the exposed SiGe layer 7 by the UHV-CVD method, so the Si layer 8 having a thickness of, for example, about 20 nm is formed. At this time, tensile strain is introduced into the Si layer 8 by the SiGe layer 7 of the lower layer. In the manner described above, the structure shown in FIG. 2B is obtained.

The structure (except for the oxide film 20) shown in FIG. 2B can also be formed by using another method. For example, by the UHV-CVD method, Si is epitaxially grown on the whole surface of the SiGe layer 7 to form the Si layer 8. Next, an oxide film is formed on the whole surface of the Si layer 8, and its part is removed. Thereafter, an exposed portion of the Si layer 8 is removed by etching. The structure (except for the oxide film 20) shown in FIG. 2B can be obtained also by such a method. In this case, the exposed portion of the Si layer 8 is not completely removed by etching but may be made to remain by a thickness of about several nano meter. The part of the Si layer 8 made to remain like this can beaded the gate insulating film 9 in an oxidation step described later.

After the structure shown in FIG. 2B is obtained, the oxide film 20 is removed. Next, as shown in FIG. 2C, portions other than element regions, the SiGe layer 7 and the strained Si layer 8 on element separation regions are removed by reactive ion etching (RIE), so the element regions are defined. Here, the region corresponding to the n-channel MOSFET 3 is denoted by the SiGe layer 7 and the strained Si layer 8, and the region corresponding to the p-channel MOSFET 41 is denoted by the SiGe layer 70.

If necessary, an impurity to suppress a short channel effect is ion injected to the region (part of the strained Si layer 8 and the SiGe layer 7) corresponding to the channel region 11 of the n-channel MOSFET 3 and the region (part of the SiGe layer 70) corresponding to the channel region 13 of the p-channel MOSFET 41. Thereafter, the gate insulating film 9 having a thickness of, for example, about 3 nm is formed by depositing an insulator or oxidizing the exposed surface.

Next, as shown in FIG. 2D, a metal layer is formed by depositing metal such as TiN or W through a sputtering method or the like over the whole surface of the substrate 2 on which the gate insulating film 9 is formed. Further, a resist pattern is formed on the metal layer, and RIE is carried out, so the gate electrode 10 of then-channel MOSFET 3 and the gate electrode 100 of the p-channel MOSFET are formed.

Thereafter, As is ion injected to the strained Si layer 8 corresponding to the n-channel MOSFET 3 and the SiGe layer 7 as the under layer thereof by using the gate electrode 10 as a mask, and further, annealing at high temperature for a short time is carried so that the source/drain regions 12 are formed. Similarly, $BF_2$ is ion injected to the SiGe layer 70 corresponding to the p-channel MOSFET 41 by using the gate electrode 100 as a mask, and further, annealing at high temperature for a short time is carried out so that source/drain regions 14 are formed. In the manner as described above, the semiconductor device 101 shown in FIG. 2D is obtained.

In the present invention, the threshold of the n-channel MOSFET becomes lower by 5.7 meV per 1%( Ge content) of SiGe under layer 7. The threshold of the p-channel MOSFET becomes lower by 7.7 meV per 1%( Ge content) of SiGe channel layer 13.

Next, a manufacturing method of CMOSFET of a second embodiment of the present invention is described with reference to FIGS. 3A to 3C.

Figure 3:
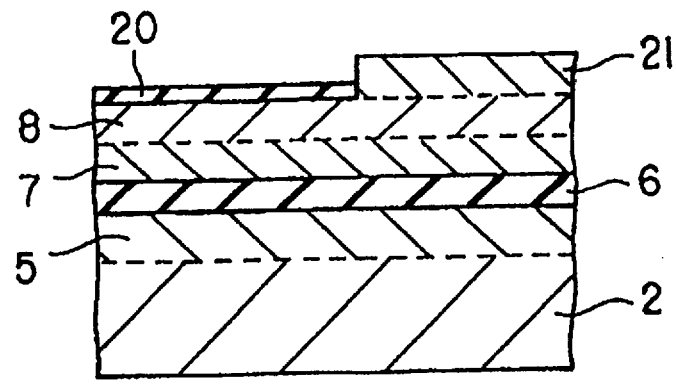
FIGS. 3A to 3C are sectional views schematically showing a manufacturing method of a semiconductor device according to a second embodiment of the present invention, respectively.
Figure 3:
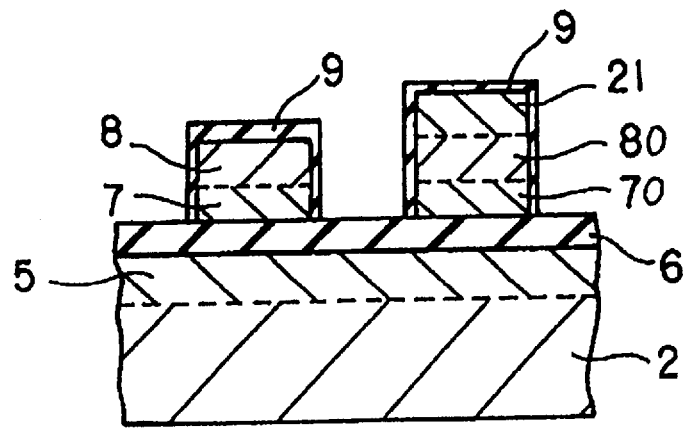
Figure 3:
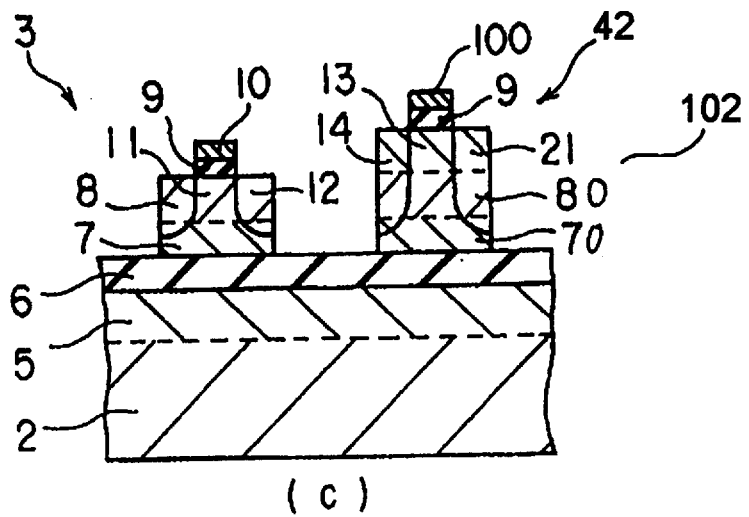

FIGS. 3A to 3C are sectional views schematically showing a method of manufacturing a semiconductor device according to a second embodiment of the present invention. A semiconductor device 102 shown in FIG. 3C includes an n-channel MOSFET 3 and a p-channel MOSFET 42 on a semiconductor substrate 2. The n-channel MOSFET 3 and the p-channel MOSFET constitute a CMOSFET.

The semiconductor device 102 shown in FIG. 3C is different from the semiconductor device 101 shown in FIG. 2D in the structure of the p-channel MOSFET. In the semiconductor device 102, the p-channel MOSPET 42 has such a structure that a SiGe layer 70, a Si layer 80, a SiGe layer 21, a gate insulating film 9, and a gate electrode 100 are sequentially laminated on an oxide film 6. The SiGe layer 70, the Si layer 80, and the SiGe layer 21 are single crystals, and tensile stress is introduced into the Si layer 80 from the SiGe layer 70.

In the semiconductor device 102 of this embodiment, the SiGe layer 70 is different from the SiGe layer 21 in the Ge concentration. In the case where the SiGe layer 70 is made of $Si_{1-x}Ge_x$ and the SiGe layer 21 is made of $Si_{1-y}Ge_y$, the relation of y>x is established. In the case where the Ge concentration is controlled so as to satisfy such a relation, compressive stress can be introduced from the Si layer 80 into the SiGe layer 21. Thus, with respect to a channel region 13 of the p-channel MOSFET 42, the energy level of the valence band edge can be raised and the threshold voltage can be lowered.

The semiconductor device 102 shown in FIG. 3C can be manufactured by, for example, a method described below.

First, in the first embodiment, the procedure explained with reference to FIG. 2A is carried out. Next, by the so-called SIMOX method, for example, an oxygen ion of an injection dosage of $4 \times 10^{17}$ cm$^{-2}$ is ion injected to the surface of the silicon substrate 2 on which the SiGe buffer layer 15 and the $Si_{1-x}Ge_x$ buffer layer 16 are formed, and further, annealing is carried out at 1350° C. to 1200° C. By that, as shown in FIG. 3A, a buried oxide film 6 is formed in the $Si_{1-x}Ge_x$ buffer layer 16. In the case where the embedded oxide film 6 is formed in this way, the region of about 400 nm from the surface of the $Si_{1-x}Ge_x$ buffer layer 16 remains not to be oxidized. The SiGe buffer layer 15 and the region of the $Si_{1-x}Ge_x$ buffer layer 16 which remains not to be oxidized are made the SiGe layers 5 and 7, respectively.

Next, Si is epitaxially grown by the UHV-CVD method over the whole surface of the silicon substrate 2 on which the SiGe layer 7 is formed, so a Si layer 8 with a thickness of, for example, about 20 nm is formed. At this time, tensile strain is introduced into the Si layer 8 from the SiGe layer 7 of the under layer.

Thereafter, an oxide film 20 such as a silicon oxide film is formed over the whole surface of the silicon substrate 2 on which the Si layer 8 is formed. Further, a part (region where the p-channel MOSFET 42 is formed) of this oxide film 20 is removed to expose a part of the strained Si layer 8. Thereafter, SiGe is selectively epitaxially grown on the strained Si layer 8 exposed by the UHV-CVD method, so a SiGe layer 21 with a thickness of, for example, about 20 nm is formed. The SiGe layer 21 made of $Si_{1-x}Ge_x$ is formed so that the Ge concentration becomes high (y>x) as compared with the SiGe layer 7 made of $Si_{1-y}Ge_y$. In general, y is within the range of 0.2 to 1.0. By doing so, compressive strain is introduced into the SiGe layer 21 from the SiGe layer 7. In the manner described above, the structure shown in FIG. 3A is obtained.

After the structure shown in FIG. 3A is obtained, the oxide film 20 is removed. Next, as shown in FIG. 3B, portions other than element regions, the SiGe layer 7, the strained Si layer 8, and the compressed SiGe layer 21 in element separation regions are removed by reactive ion etching (RIE), so the element regions are defined. Here, the region corresponding to the n-channel MOSFET 3 is denoted by the SiGe layer 7 and the strained Si layer 8. The region corresponding to the p-channel MOSFET 42 is denoted by the SiGe layer 70, the strained Si layer 80, and the compressed SiGe layer 21.

If necessary, an impurity to suppress a short channel effect is ion injected to the region (part of the strained Si layer 8 and the SiGe layer 7) corresponding to the channel region 11 of the n-channel MOSFET 3 and the region (part of the strained Si layer 80, the SiGe layer 70, and the SiGe layer 21) corresponding to the channel region 13 of the p-channel MOSFET 41. Thereafter, a gate insulating film 9 is formed by depositing an insulator or oxidizing the exposed surface.

Next, as shown in FIG. 3C, a metal layer is formed by depositing metal such as TiN or W through a sputtering method or the like over the whole surface of the substrate 2 on which the gate insulating film 9 is formed. Further, a resist pattern is formed on the metal layer and RIE is carried out, so a gate electrode 10 of the n-channel MOSFET 3 and a gate electrode 100 of the p-channel MOSFET 42 are formed.

Thereafter, As is ion injected to the strained Si layer 8 corresponding to the n-channel MOSFET 3 and the SiGe layer 7 as the under layer thereof by using the gate electrode 10 as a mask. Further, high temperature short time annealing is carried out, so that source/drain regions 12 are formed. Similarly, $BF_2$ is ion injected to the SiGe layer 70, the strained Si layer 80, and the compressed SiGe layer 21 corresponding to the p-channel MOSFET 41 by using the gate electrode 100 as a mask. Further, high temperature short time annealing is carried out so source/drain regions 14 are formed. In the manner as described above, the semiconductor device 102 shown in FIG. 3c is obtained.

In the first and second embodiments as described above, although the gate electrode 10 of the n-channel MOSFET 3 and the gate electrode 100 of the p-channel MOSFET 41 or 42 are made of TiN, W or the like, as long as a metal material is such that its work function is higher than the energy difference between the vacuum level and the conduction band edge of the strained Si layer 8, and is lower than the energy difference between the vacuum level and the valence band edge of the SiGe layer 70 or the compressed SiGe layer 21, the other metal material can also be used. The material making the gate electrode 10 of the n-channel MOSFET 3 and the gate electrode 100 of the p-channel MOSFET 41 or 42 is not limited to the metal material, but poly Ge doped with a p-type impurity at a high concentration, $Si_{1-y}Ge_y$ (y>x) or the like can also be used.

In the first and second embodiments, as the structure of the n-channel MOSFET 3 and the p-channel MOSFET 41 or 42, the SOI MOSFET in which element separation and well separation is easy, is adopted, a normal bulk MOSFET may be naturally adopted.

As described above, in the semiconductor device of the present invention, the same material can be used for a gate electrode of an n-channel field effect transistor and a gate electrode of a p-channel field effect transistor. Thus, according to the present invention, threshold voltages of both the n-channel field effect transistor and the p-channel field effect transistor can be sufficiently lowered.

According to the present invention, there is provided a semiconductor device which includes an n-channel field effect transistor and a p-channel field effect transistor constituting a complementary field effect transistor and can be manufactured by a simplified process.

What is claimed is:
1. A semiconductor device comprising:
   a semiconductor substrate;
   an n-channel field effect transistor formed on the semiconductor substrate;
   and a p-channel field effect transistor formed on the semiconductor substrate, the n-channel field effect transistor and the p-channel field effect transistor constituting a complementary field effect transistor,
   wherein a gate electrode of the n-channel field effect transistor and a gate electrode of the p-channel field effect transistor are made of a same material,
   wherein a channel region of the n-channel field effect transistor is made of a material which contains at least of Si and in which an energy difference between a conduction band edge and a vacuum level is higher than that of bulk Si, and a channel region of the p-channel field effect transistor is made of a material which contains at least of Si and in which an energy difference between a valence band edge and the vacuum level is lower than that of bulk Si, and wherein a work function of the material making the gate electrodes is higher than the energy difference between the conduction band edge of the material making the channel region of the n-channel field effect transistor and the vacuum level, and is lower than the energy difference between the valence band edge of the material making the channel region of the p-channel field effect transistor and the vacuum level.

2. A semiconductor device according to claim 1, wherein tensile stress is introduced into the material making the channel region of the n-channel field effect transistor.

3. A semiconductor device according to claim 1, wherein compressive stress is introduced into the material making the channel region of the p-channel field effect transistor.

4. A semiconductor device according to claim 1, wherein the material making the channel region of the n-channel field effect transistor is strained Si.

5. A semiconductor device according to claim 1, wherein the material making the channel region of the p-channel field effect transistor is SiGe.

6. A semiconductor device according to claim 1, wherein the Fermi level $E_F$ of the gate electrode material is $(4E_{v2}+E_{c1})/5$ or less and $(E_{v2}+4E_{c1})/5$ or less, $E_{v2}$ is the valence band edge of the material making the channel region of the p-channel field effect transistor and $E_{c1}$ is the conduction band edge of the material making of the channel region of the n-channel field effect transistor.

7. A semiconductor device according to claim 1, wherein the Fermi level $E_F$ of the gate electrode material is substantially $(E_{v2}+E_{c1})/2$, $E_{v2}$ is the valence band edge of the material making the channel region of the p-channel field effect transistor and $E_{c1}$ is the conduction band edge of the material making of the channel region of the n-channel field effect transistor.

8. A semiconductor device according to claim 1, wherein $E_{c1}$ of the channel material of the n-channel MOSFET is higher than $(E_{v0}+9E_{c0})/10$ and not higher than $(E_{v0}+E_{c0})/2$, $E_{v0}$ is the valence band edge of the bulk Si and $E_{c0}$ is the conduction band edge of the bulk Si.

9. A semiconductor device according to claim 1, wherein $E_{v2}$ of the channel material of the p-channel MOSFET is not less than $(E_{v0}+E_{c0})/2$ and less than $(9E_{v0}+E_{c0})/10$, $E_{v0}$ is the valence band edge of the bulk Si and $E_{c0}$ is the conduction band edge of the bulk Si.

10. A semiconductor device comprising:

a semiconductor substrate;

an n-channel field effect transistor formed on the semiconductor substrate; and a p-channel field effect transistor formed on the semiconductor substrate, the n-channel field effect transistor and the p-channel field effect transistor constituting a complementary field effect transistor, wherein a gate electrode of the n-channel field effect transistor and a gate electrode of the p-channel field effect transistor are made of a same material, wherein at least a part of a channel region of the n-channel field effect transistor is formed in a strained Si layer, wherein at least a part of a channel region of the p-channel field effect transistor is formed in a first SiGe layer, and wherein a work function of the material making the gate electrodes is higher than an energy difference between a conduction band edge of the strained Si layer and a vacuum level, and is lower than an energy difference between a valence band edge of the first SiGe layer and the vacuum level.

11. A semiconductor device according to claim 10, wherein the n-channel field effect transistor includes a second SiGe layer which has the same composition ratio as the first SiGe layer and is disposed between the semiconductor substrate and the strained Si layer, and tensile stress is introduced into the strained Si layer from the second SiGe layer.

12. A semiconductor device according to claim 10, wherein the n-channel field effect transistor includes a second SiGe layer which has a Ge concentration higher than the first SiGe layer and is disposed between the semiconductor substrate and the strained Si layer, the p-channel field effect transistor includes a third SiGe layer which has the same composition ratio as the second SiGe layer and is disposed between the semiconductor substrate and the first SiGe layer, tensile stress is introduced into the strained Si layer from the second SiGe layer, and compressive stress is introduced into the first SiGe layer from the third SiGe layer.

13. A semiconductor device according to claim 12 wherein the p-channel field effect transistor includes a Si layer between the first SiGe layer and the third SiGe layer.

14. A semiconductor device according to claim 12, wherein the first SiGe layer composes $Si_{1-x}Ge_x$ and the second SiGe layer composes $Si_{1-y}Ge_y$, (y>x).

15. A semiconductor device according to claim 1, wherein the gate electrode is made of a material selected from the group consisting of metal, doped p-type polycrystalline Ge, and doped p-type polycrystalline SiGe.

16. A semiconductor device according to claim 10, wherein the gate electrode is made of a material selected from the group consisting of metal, doped p-type polycrystalline Ge, and doped p-type polycrystalline SiGe.

17. A semiconductor device according to claim 1, further comprising an insulating film between the semiconductor substrate and the complementary field effect transistor.

18. A semiconductor device according to claim 10, further comprising an insulating film between the semiconductor substrate and the complementary field effect transistor.

19. A semiconductor device comprising:

a semiconductor substrate;

an n-channel field effect transistor formed on the semiconductor substrate; and a p-channel field effect transistor formed on the semiconductor substrate, the n-channel field effect transistor and the p-channel field effect transistor constituting a complementary field effect transistor, wherein a gate electrode of the n-channel field effect transistor and a gate electrode of the p-channel field effect transistor are made of a same material, and wherein one of the n-channel field effect transistor and the p-channel field effect transistor includes a first semiconductor layer in which at least a part of a channel region is formed, the other of the n-channel field effect transistor and the p-channel field effect transistor includes a second semiconductor layer in which at least a part of a channel region is formed and a third semiconductor layer as its under layer, and the first semiconductor layer and the third semiconductor layer are made of a same material.

20. A semiconductor device according to claim 19, further comprising an insulating film between the semiconductor substrate and the complementary field effect transistor.

21. A semiconductor device according to claim 19, wherein a work function of the material making the gate electrode is higher than an energy difference between a conduction band edge of a material making the channel region of the n-channel field effect transistor and a vacuum level, and is lower than an energy difference between a valence band edge of a material making the channel region of the p-channel field effect transistor and the vacuum level.

* * * * *

UNITED STATES PATENT AND TRADEMARK OFFICE
CERTIFICATE OF CORRECTION

PATENT NO. : 6,339,232 B1
DATED : January 15, 2002
INVENTOR(S) : Shinichi Takagi Page 1 of 1

It is certified that error appears in the above-identified patent and that said Letters Patent is hereby corrected as shown below:

Title page,
Item [73], in the Assignee, change "Kabushika" to -- Kabushiki --.

Column 13,
Line 30, change "electrodematerial" to -- electrode material --.

Signed and Sealed this

Twenty-first Day of May, 2002

Attest:

JAMES E. ROGAN
*Attesting Officer*  *Director of the United States Patent and Trademark Office*